(12) United States Patent
Prusseit

(10) Patent No.: US 9,153,362 B2
(45) Date of Patent: Oct. 6, 2015

(54) COATING OF TECHNICAL SUBSTRATES FOR MANUFACTURING SUPER-CONDUCTING LAYERS WITH HIGH TRANSITION TEMPERATURE

(71) Applicant: Theva Dünnschichttechnik GmbH, Ismaning (DE)

(72) Inventor: Werner Prusseit, München (DE)

(73) Assignee: Theva Dünnschichttechnik GmbH, Ismaning (DE)

( * ) Notice: Subject to any disclaimer, the term of this patent is extended or adjusted under 35 U.S.C. 154(b) by 222 days.

(21) Appl. No.: 14/286,538

(22) Filed: May 23, 2014

(65) Prior Publication Data

US 2014/0378313 A1    Dec. 25, 2014

(30) Foreign Application Priority Data

Jun. 12, 2013    (DE) .......................... 10 2013 210 940

(51) Int. Cl.
| | |
|---|---|
| *H01B 12/00* | (2006.01) |
| *H01B 12/06* | (2006.01) |
| *C23C 18/12* | (2006.01) |
| *H01L 39/24* | (2006.01) |
| *H01B 13/00* | (2006.01) |
| *H01L 39/12* | (2006.01) |

(52) U.S. Cl.
CPC .............. *H01B 12/06* (2013.01); *C23C 18/122* (2013.01); *C23C 18/1241* (2013.01); *C23C 18/1275* (2013.01); *C23C 18/1279* (2013.01); *C23C 18/1283* (2013.01); *H01B 13/0036* (2013.01); *H01L 39/12* (2013.01); *H01L 39/24* (2013.01); *H01L 39/2461* (2013.01)

(58) Field of Classification Search
CPC .... H01B 12/06; H01B 13/036; C23C 18/122; C23C 18/1241; C23C 18/1275; C23C 18/1279; C23C 18/1283; H01L 39/2461; H01L 39/12; H01L 39/24
See application file for complete search history.

(56) References Cited

FOREIGN PATENT DOCUMENTS

| | | |
|---|---|---|
| DE | 102004027857 | 1/2006 |
| DE | 112004000819 | 4/2010 |

*Primary Examiner* — Colleen Dunn
(74) *Attorney, Agent, or Firm* — Meyertons Hood Kivlin Kowert & Goetzel, P.C.; Jeffrey C. Hood; Brian E. Moore

(57) ABSTRACT

The present invention refers to a method for applying a smoothening layer on a band substrate for subsequent manufacturing a high temperature superconductor tape, wherein the method comprises the steps: (a) applying a liquid containing polysilazane on at least one side of the band substrate; and (b) heating the liquid containing polysilazane to a temperature $\geq 450°$ C. for depositing a layer on the band substrate which comprises silicon oxynitride ($SiN_xO_y$, wherein $0 \leq x < 0.6$ and $1.0 < y \leq 2.0$), and/or silicon-carbon-oxynitride ($SiC_xN_yO_z$, $2 \cdot y < x \leq 1.0$, $0 < y < 0.2$ and $1.0 < z \leq 2.0$).

24 Claims, 4 Drawing Sheets

COATING OF TECHNICAL SUBSTRATES FOR MANUFACTURING SUPER-CONDUCTING LAYERS WITH HIGH TRANSITION TEMPERATURE

PRIORITY CLAIM

This application claims benefit of priority of German application no. 102013210940.7 titled "Coating of Technical Substrates for Manufacturing Super-Conducting Layers with High Transition Temperature", filed Jun. 12, 2013, and whose inventor is Werner Prusseit.

INCORPORATED BY REFERENCE

German application no. 102013210940.7 titled "Coating of Technical Substrates for Manufacturing Super-Conducting Layers with High Transition Temperature", filed Jun. 12, 2013, and whose inventor is Werner Prusseit, is hereby incorporated by reference in its entirety as though fully and completely set forth herein.

TECHNICAL FIELD

The present invention refers to the deposition of a smoothening layer on a band substrate for subsequent manufacturing of a high temperature superconductor tape.

DESCRIPTION OF THE RELATED ART

The present invention refers to the manufacturing of crystalline oriented layers on technical substrates, in particular of high temperatures superconductors. Technical substrates are supports which can be manufactured economically compared to mono-crystalline supports and which have not to be subjected an expensive surface polish in order to particularly smoothening the surface. Such technical substrates in particular comprise ceramics or metal sheets and metal foils.

Thin bi-axially oriented layers are applied in the technology on a broad basis. Thin layers of high temperature superconductors (HTS) are typi-cal examples which are applied in both the high frequency engineering and the power engineering. The vanishing of the electrical resistance below the transition temperature TC enables low line loss and the increasing of the energy conversion efficiency of various apparatuses for storing electric energy, conversion of electric energy, or the transport of electric energy. In order to ensure the high current load capacity of the HTS layer of >1 MA/cm2 large angle grain boundaries have to be avoided as far as possible in these materials. Therefore, optimal results can only be achieved with nearly mono-crystalline bi-axially textured layers.

Thereby, the HTS layer should ideally be applied on a thin metal band having a large length (HTS tape). Such a HTS tape, which is in the following also called "tape", can replace copper wires in established applications and can transport much higher currents in these applications. These high currents would lead to large ohmic losses in copper. When using superconductors these losses can be reduced.

In addition to that components can also be improved at which metallic low temperature superconductors are already at the moment used instead of copper conductors, as for example magnetic resonance tomo-graphs, or strong electro magnets. High temperature superconductors (HTS) allow a significantly higher operation temperature and can withstand larger magnetic fields. This results in a simpler set-up and an improvement of the energy conversion efficiency due to the resulting reduction of the cooling effort.

In addition there are also applications, for example in the high frequency technology, in which the substrate has not to be electrically conducting. For these cases, other substrates could also be applied, as for example ceramics instead of metal substrates.

Apart from the HTS examples mentioned here, there are however still a variety of further materials having specific electrical properties as for example ferro-electricity, thermo-electric effects and magnetism, which can preferably be used in a bi-axially textured form in the field of sensor technology. For these cases also cost effective substrates are needed with suitable surface properties which allow the manufacturing of thin oriented layers of these materials.

For the deposition of oriented epitaxial layers mono-crystalline substrates typically are needed which specify the arrangement of the atoms in the layer, and thus its crystalline orientation. Since substrates are very expensive and are not available in any size, it is beneficial to use low cost technical substrates as supports, as for example polycrystalline ceramics or metal sheets or metal foils. In order to produce the missing crystallographic orientation in the technical substrates, specific coating processes have been developed for the generation of bi-axially oriented buffer layers which serve as epitaxial support or epitaxial layers. An established process is "ion beam assisted deposition" (IBAD) at which a supporting ion beam is directed onto the surface substrate having a specific angle during the deposition. Basic variants of this method are described in the EP 0 872 579 and EP 1 178 129. At another common process, called "inclined substrate deposition" (ISD), the coating from the vapor phase occurs on a tilted substrate under an angle. In this way, oriented layers can also be deposited with high deposition rates when suitably selecting the deposition parameters. This method is described in detail in EP 0 669 411 and EP 0 909 340.

In order that well oriented layers can be manufactured by this process, the substrate has to have a roughness or surface roughness as low as possible. Typically, RMS (root mean square) roughness values of less than 2 nm are required. While long wave modulations of the substrate surface rarely play a role for the microscopic orientation process, a microscopic roughness, superficial precipitates, trenches at grain boundaries or scratches with sharp edges inevitably leads to a loss of orientation around the disordered section. Since such defects exist in technical substrates with a high area density, technical substrates having such surfaces are not readily suitable for the coating.

Thus, such surfaces are typically chemo-mechanically polished prior to the coating or are electro polished in case of metal surfaces. In some cases, the substrate surface can also be smoothed by melting for example by using a laser. However, these processes are often slow and cause considerable costs.

A glaze of a surface is a known method for smoothening surfaces. For this purpose, a coating material is applied in form of a powder to the surface to be coated and the powder is fused. The fused material covers the surface with a layer which solidifies when it is cooled down and forms the glaze. However, glazes are not suited in many cases, in particular if HTS layers have to be manufactured. On the one hand, epitaxy is almost generally performed at very high substrate temperatures. For example for HTS these temperatures are above 650° C. However, at the manufacturing temperature of the epitaxy layer, the glaze is not allowed to melt. Thus, glasses are needed which have a high melting temperature. On the other hand, it is necessary to avoid to high temperatures especially on metallic substrates, since the mechanical stability of the metal could be impaired and disturbing diffusion processes will start with an increasing rate. Due to the microscopic granularity of the powder, glaze layers are additionally relatively thick—typically at least 10 μm. This is not acceptable for flexible substrates, as for example metal tapes, since the glaze impairs flexibility and easily flakes off at a high bending. A further negative aspect of glazes is the combination of a large layer thickness and a low thermal conductivity of the glass. Especially for HTS applications heating generated at a sudden transition into the normal conduction state (quench) has to be rapidly discharged into the substrate in order to avoid a fusing of the layer. However, a thick glaze which is poorly heat conducting inevitably leads to a heat build-up in this situation.

Thus, the desired epitaxial support should be as thin as possible and it should maximally have a thickness of several micrometers. Apart from high temperature stability and low surface roughness, the support should also have a good adhesion to the substrate, should be chemically compatible with the following coatings, and should represent a good diffusion barrier. When using metallic substrates, the protection of the substrate surface against oxidation is also important.

Such layers can be applied in form of metal oxides by means of physical coating processes. For example this is described for the IBAD process in WO 02/047 119. However, when applying such thin substrates no smoothening effect occurs, but the surface roughness of the substrate repeats at the layer surface. Thus, the layer surface itself has to be treated by polishing. Then a further oxide or oxynitride layer has to be applied in order to reconstruct the surface before one can proceed with the actual orientation layer. Therefore, the described method is involved and cost-intensive.

Metal oxide layers used as epitaxial support in HTS tapes are also described in U.S. Pat. No. 6,235,402. In this case, the metallic substrate is already textured prior to the coating by mechanically deformation (rolling) and annealing for the epitaxy, and the surface is also smoothed to a microscopic scale. In this case, the described sole gel process is to be considered as a pure alternative to a physical coating process. It has the purpose to manufacture epitaxial layers, which pass the orientation of the layer to the following layers. A smoothening of the substrate is neither intended nor described.

The substrate smoothening by the application of a sole gel technique is described in US 2012/0 040 100 A1. By repeated coatings and thermal treatments a metal organic precursor is applied in a thin layer and is transformed into a metal oxide. In order to achieve the desired smoothening effect by the formation of multilayers, the procedure has to be repeated five to ten times with solutions having different metal concentrations. Thus, the method is inconvenient and additionally restricted to metal oxides. In this document a selection of materials is indicated which are chemically compatible with the HTS layer, as yttrium oxide, rare earth oxides, zirconium oxide and titanium dioxide.

The present invention is therefore based on the problem to provide a method for manufacturing a smoothening layer on a technical substrate which at least partially avoids the above discussed drawbacks.

SUMMARY OF THE INVENTION

According to a realization example of the present invention, this problem is solved by an exemplary embodiment of a method for applying a smoothening layer on a band substrate for the subsequent manufacturing of a high temperature superconductor tape comprises the steps: (a) applying a liquid containing polysilazane on at least one side of the band substrate; and (b) heating the liquid containing polysilazane to a temperature>450° C. for depositing a layer on the band substrate comprising silicon oxynitride ($SiN_xO_y$, wherein $0<x$ 0.6 and $1.0<y<2.0$) and/or silicon-carbon-oxynitride ($SiC_xN_yO_z$, wherein 2 $y<x<1.0$, $0<y<0.2$ and $1.0<z<2.0$).

According to the invention a smoothening and preparation of the band substrates are preferably achieved by a wet chemical process, wherein the band substrates have a large RMS (root-mean square) roughness for a later coating with a HTS layer. The band substrate is coated by common processes of wet coating, for example immersing, spraying, printing, squeegeeing, rolling, and spreading with the coating material which is available in a solution or in form of nanoscopic particles in an aqueous or organic solution. As a consequence of the low particle size very thin and homogenous layers can be manufactured. The solution or the particles penetrates in the smallest pores of the substrate and fill these pores or particles and irregularities on the surface are embedded in the liquid. When a good wetting is available, the liquid surface smoothes on a microscopic scale due to the surface tension and forms a closed film.

The subsequent epitaxy of layers leads to high requirements on the surface coating arranged in such a manner. This includes for example stability at high temperatures, chemical compatibility, good adhesion, etc. so that the selection of suitable material is of vital importance. According to the invention silicon organic compounds as for example polysilazane are used for the coating. These compounds are transformed into high temperature stable, inorganic layers of silicon oxynitride ($SiN_xO_y$) and/or silicon-carbon-oxynitride ($SiC_xN_yO_z$) by a subsequent thermal treatment.

Oriented intermediate layers (buffer layers) can be generated on these amorphous supports using established methods, as for example "inclined substrate deposition" (ISD) or "ion beam assisted deposition" (IBAD). The epitaxy of the desired functional layer, as for example the HTS $RBa_2Cu_3O_7$ (R=Yttrium or an element of the rare earths) can be performed on the oriented layers.

According to a further aspect, the deposited layer comprises a surface roughness of <10 nm, preferred <5 nm, more preferred <2 nm, and most preferred <1 nm.

According another aspect, the deposited layer comprises a thickness of 0.01 μm-10.0 μm, preferred 0.1 μm-5.0 μm, more preferred 0.2 μm-3.0 μm, and most preferred 0.3 μm-1.0 μm.

In a preferred aspect, the composition of the deposited layer changes with the depth of the layer.

The gradient of this change is a signature for the deposition of a smoothening layer on a band substrate.

According to still another aspect, the band substrate comprises a metal stripe which has a surface roughness of less than 20 nm.

In an aspect, step (b) is performed in a surrounding atmosphere. According to a further aspect, step (b) is performed in a pure oxygen atmosphere or in a shielding gas atmosphere.

According to still another aspect, steps (a) and (b) are successively executed several times.

According to a further aspect, the above indicated method further comprises a step: adjusting the thickness of the deposited layer by selecting a viscosity of the polysilazane solution and/or by selecting a concentration of the polysilazane solution.

In a beneficial aspect, the layer deposited on the substrate has an adhesive strength>10 N·mm-2.

In another aspect, the polysilazane comprises perhydropolysilazane (PHPS), and the liquid comprises a solution of PHPS in dibutyl ether. According to still another aspect, the PHPS solution comprises 10 weight-% to 20 weight-% PHPS. In other words, the PHPS solution comprises 10 to 20 percent PHPS by weight. In a preferred aspect, the temperature for heating the polysilazane solution is in the range of 600° C.-700° C. and/or a temperature increase occurs with 5° C./min, and/or a maximum temperature is maintained for ≤60 minutes, and/or a temperature decrease occurs with 5° C./min. In still a further aspect, the mean nitrogen content of the deposited layer containing silicon oxynitride is smaller than 30 atom-%, preferred smaller than 25 atom-%, and is most preferred in range of 15 atom-% to 20 atom-%.

Here mean nitrogen content means a nitrogen concentration averaged across the depth of the layer containing silicon oxynitride.

In a beneficial aspect, the oxygen portion decreases from the surface into the depth of the deposited layer containing silicon oxynitride, and the silicon portion and the nitrogen portion increase. According another aspect, the polysilazane comprises polycarbosilazane (PCS) and the liquid comprises a solution of PCS in toluol and/or in ether. According to another aspect, the PCS solution comprises 10 weight-% to 20 weight-% PCS, and/or the deposited layer comprises silicon-carbon-oxynitride.

In a further beneficial aspect, step (a) comprises applying the polysilazane containing liquid on a front side and a back side and the above indicated method further comprises the steps: (c) depositing at least one high temperature superconductor layer on the front side of the band substrate; (d) removing the layer containing silicon oxynitride and/or silicon-carbon-oxynitride from the back side of the band substrate; and (e) applying a metal and/or a metal alloy on at least the back side of the band substrate.

In another aspect, step (e) comprises: applying the metal and/or the metal alloy on the high temperature superconductor layer and on the back side of the band substrate. In a further preferred aspect, the metal comprises silver.

Another preferred aspect comprises a contact layer on the backside for a high temperature superconductor tape manufactured according to one of the preceding aspects.

According to a further advantageous aspect, the band substrate for manufacturing a high temperature superconducting tape is manufactured according to a method of one of the above indicated aspects.

In still a further preferred aspect, the method for manufacturing a high temperature superconducting tape comprises the following step: depositing at least one high temperature superconductor layer on the tape substrate which is manufactured according to one of the above described aspects.

Finally, according to another preferred aspect, a high temperature superconducting tape comprises: (a) a band substrate; (b) at least one smoothening layer manufactured on the band substrate according to one of the above discussed aspects; (c) at least one high temperature superconductor layer; and (d) a metallization layer manufactured according to one of the above described aspects.

BRIEF DESCRIPTION OF THE DRAWINGS

In the following detailed description presently preferred realization examples of the invention are described referring to the figures, wherein FIG. 1 indicates a flow chart of an exemplary method for manufacturing a HTS tape consisting of conditioning of the substrate surface and coating.

Figure 1:
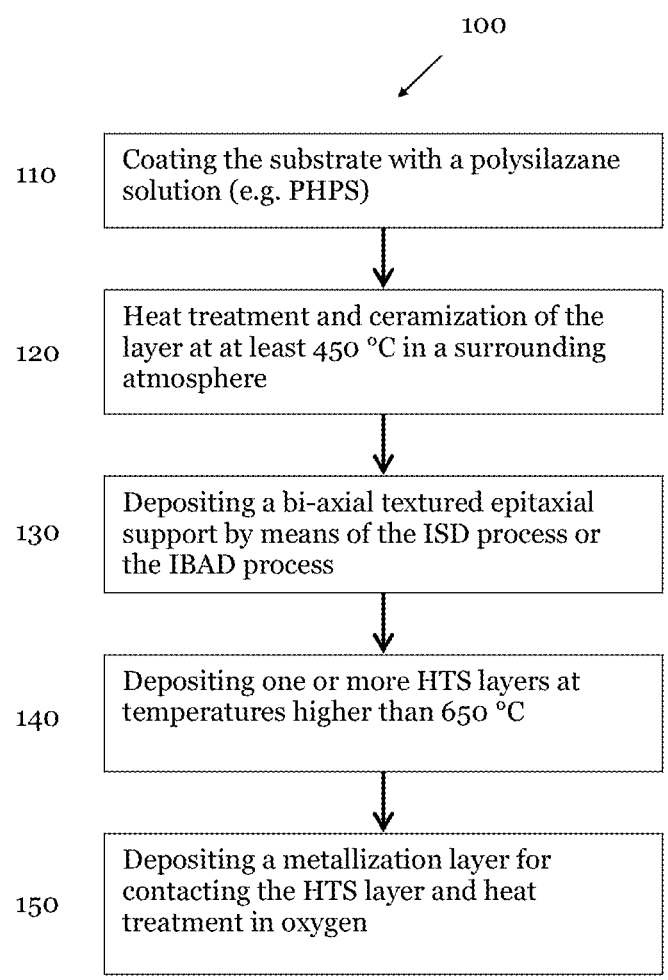

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

In the following presently preferred embodiments of the inventive method and the inventive apparatus are explained in more detail. These embodiments are explained using the example of applying a smoothening layer on a band substrate which is subsequently used for manufacturing a high temperature superconductor (HTS). However, the inventive method and the inventive apparatus are not restricted to the application in the field of HTS. Rather, a smoothening layer described in this application or generally a coating layer can generally be used for reducing a surface roughness of technical substrates.

As already indicated in the introductory part, technical substrates are supports or substrates which can be manufactured in a cost-effective manner compared to mono-crystalline substrates and which are not subjected to an involved surface polishing in order to reduce their surface roughness below a predetermined threshold. Technical substrates comprise electrical conductors, for example metal sheets, metal tapes or metal foils. Furthermore, technical substrates can comprise semiconductor materials and/or compound semiconductors having a crystalline, a polycrystalline or an amorphous structure. Finally, technical substrates also comprise the class of isolators, as for example ceramic materials.

In the following examples, a HTS layer is deposited on the smoothening layer in subsequent process steps. Not only one HTS layer can be applied on a smoothening layer or coating layer described in this application. Rather, any bi-axially oriented layer can be deposited on a smoothening layer according the invention. Apart from the application range of HTS tapes bi-axially oriented layers can also be used in the field of high frequency technology in of power engineering. Apart from the application fields HTS, high frequency technology and power engineering there is still a multitude of further materials with particular electronic properties as for example ferro-electricity, thermal electrical effects and magnetism which can preferably be used in bi-axially textured form for sensor applications. For all mentioned application fields, cost-effective substrates with suitable surface properties are needed in particular with low surface roughness which enables the manufacture of thin oriented layers on these substrates.

Mass produced substrates, as for example ceramic surfaces or metal surfaces, may have relatively a large RMS roughness>20 nm caused by production. For coating processes for which high temperatures above 600° C. and a partly reactive atmosphere (oxygen) are used, inorganic layers are required as supports, which provide a smooth surface, which are chemically compatible with the actual functional layers, which provide barriers with respect to the diffusion of substrate constituents into the functional layer, and, if applicable, which protect the substrate against oxidation.

For the specific case of manufacturing high quality buffer layers having a biaxial texture, for example by means of the IBAD or the ISD process, typically a surface roughness is required of less than 2 nm, preferably less than 1 nm. If the substrate has neither very sharp tips nor edges, the respective smoothening can relatively simply be achieved by layers which are applied from the liquid phase. The layer applied in such a manner is transformed in a stable, closed, amorphous or polycrystalline inorganic layer by thermal treatment. From the prior art, for example EP 0 611 067 compounds from the class of polysilazane are known which are suitable for the manufacture of dielectric SiO2 layers for electronic applications. According to DE 10 2006/008 308 A1 ceramized polysilazane can be used on metal surfaces for protecting against oxidation or against scale formation. The term "ceramization" means in this application the transformation of a liquid containing polysilazane in an amorphous layer containing silicon oxynitride layer and/or silicon-carbon-oxynitride.

However, polysilazanes are still unknown or have up to now never been used as coating support for high temperature coating processes, as for example for the manufacture of HTS tapes. Therefore, the compatibility with the manufacturing process of HTS tapes was not clear.

FIG. 1 schematically represents a flow diagram 100 of an inventive method for the manufacture of high quality bi-axially textured functional layers on metal substrates or on ceramic substrates. In the first step 110, the flow diagram comprises the wet chemical application of a polysilazane solution on the substrate surface. A multitude of processes can be selected for this purpose, as for example immersing, spraying, spinning, printing, squeegeeing, rolling, etc. Among others the layer thickness can be adjusted by means of the viscosity of the solution and the concentration of the polysilazane solution. For coating experiments and for the manufacture of HTS tapes preferably a solution of 20 weight-% perhydropolysilazane (PHPS) (Supplier: Clariant Advanced Materials GmbH) in dibutyl ether is used which is applied by immersing coating or spinning in a single coating step. For thinner layers of up to 300 nm a lower viscosity and higher degree of dilution below 20 weight-%, preferred approximately 10 weight-% are selected.

In the second step 120, the coated substrates are heated in an oven in a surrounding atmosphere and the polysilazane layer is transformed in a ceramic layer (ceramized). The heat treatment can also occur in a pure oxygen atmosphere or a shielding gas atmosphere which is reflected in the composition of the ceramic layer. As needed, the first two steps 110 and 120 can also be repeatedly applied. A complete pyrolysis and ceramization of PHPS is only achieved at temperatures above 450° C.

Preferably, the samples are treated at 600° C.-700° C. in order to achieve a complete transformation. In this process, a perhydropolysilazane (PHPS) layer is transformed into an amorphous silicon oxynitride layer $SiN_xO_y$ ($0 \leq x < 0.6 \cdot y$ and $1 < y \leq 2$). The mean nitrogen content of a layer is below 25 atom-%, typically between 15-20 atom-%.

Caused by production, at the transformation of the layer containing polysilazane in a silicon oxynitride comprising layer the ligands hydrogen and partially also nitrogen are replaced by oxygen. This reaction proceeds from the surface into the depth of the layer driven by diffusion. Thus, a gradient of the composition of the layer is formed as a function of its depths. This gradient represents a signature of the process and can be analyzed by GDOES (glow discharge optical emission spectroscopy). Investigations concerning this technique can be found for example in M. Günthner et al., in Journal of the European Ceramic Society 29 (2009), pages 2061-2068. In ceramized PHPS layers, the oxygen portion significantly decreases starting from the surface into the depths, whereas the silicon and the nitrogen portions increase. In a depth of 200 nm the weight portion of oxygen is at least 5-10% lower than at the surface analyzed with GDOES. At thicker layers, the decrease is still significantly higher. In a depth of 500 nm the oxygen portion is less than 15% below the surface concentration.

In the third step 130 bi-axially oriented buffer layers can be manufactured on this support by the above mentioned coating techniques. The processes can require applying several layers. In the ISD process an oriented MgO double layer is generated, wherein the first MgO layer is deposited at room temperature and using a tilting angle of at least 20°, whereas the second MgO cover layer is deposited at a higher temperature, typically >700° C., and at a perpendicular incidence on the substrate.

Mostly, the IBAD process also uses multiple layers. In a high temperature process preferably epitaxial layers of CeO2, SrTiO3, LaMnO3, LaZrO3 among others are preferably deposited on the orientation layers of cubic Yttrium stabilized zircon oxide (YSZ), MgO, TiN or layers having a pyrochlore structure, as for example Gd2Zr2O7.

Then in step 140 the actual superconducting functional layer RBa2Cu3O7 is deposited, wherein R represents Yttrium or an element of the rare earths. For the epitaxial coating, substrate temperatures above 650° C. are used. Finally, at step 150, a thin metallization layer, typically of silver, is used for contacting. By means of a final temperature treatment in an oxygen atmosphere (ramp between 600° C. and room temperature) the HTS layer is loaded with oxygen through the silver layer and a highly conductive electrical contact is manufactured to the HTS layer. In this process, contact resistances of typically <1 µΩ·cm2 are achieved.

During the high temperature processes the $SiN_xO_y$ layer additionally acts as a diffusion barrier with respect to the substrate. For example, it suppresses the chromium diffusion from the metal substrate, in particular from Hastelloy® C276, and thus suppresses the formation of spinel at the boundary layer to the MgO layer in the ISD process. As a consequence, the adhesion of the overall coating on the metal substrate is also improved. Using mechanical pull off tests with an affixed punch adhesive strengths of the coating above 10 MPa (10 N/mm2) could be determined by means of an adhesive tester.

If the $SiN_xO_y$ layer is only used as a diffusion barrier or as an adhesion, layer thicknesses between 10-200 nm are already sufficient. If the layer is additionally used for substrate smoothening the thickness should on the other hand be in the range of 0.2-3 µm. Preferably a layer thickness in the interval between 0.3-1.0 µm is selected since for layer thicknesses above 1 µm the risk of crack formation strongly increases. A RMS roughness of the layer below 2 nm is achieved at a typical measuring field size of 10×10 µm2 when using an atomic force microscope (AFM) for measurement.

Similar results can be achieved when using polycarbosilazane (PCS) solutions instead of PHPS. Toluol and/or ether are used as solvents in this case. Also in this case preferably solutions are used having a PCS portion of approximately 10-20 weight-%. However, depending from the treatment temperature in the pyrolysis process $SiC_xN_yO_z$ is formed with a higher carbon portion and a higher nitrogen portion at lower temperature below 600° C., and nearly pure $SiO2$ is formed at very high temperatures>800° C. Typically, it is $2 \cdot y < x < 1.0$, $0 \leq y < 0.2$, $1 < z \leq 2$. Since the complete pyrolysis process of PCS requires up to 200° C. higher temperatures compared to PHPS, PHPS is particularly preferred on metal substrates.

The conversion of the polymer silazane layer in a ceramic should preferably be performed in the same temperature range as the epitaxial coating processes (buffer layer, HTS-layer) in order to achieve a complete or sufficient transformation reaction within the silicon oxynitride layer or the silicon-carbon-oxynitride layer and to avoid a shrinkage or a crack formation during the coating process.

The back side of the substrate also plays an important role in the manufacturing process of HTS tapes since an inhomogeneous blackening or discoloration of the back side of metal tape by scaling during the ceramization phase can lead to a local variation of the infrared absorption. This leads to inhomogeneous substrate temperatures and to a variation of the quality of HTS tapes during the coating processes for buffer layers and HTS layers which take place at high temperatures and at which the band is typically heated from the back side. If the coating process and conversion process described above is also applied to the back side of the substrate, the layer containing silicon oxynitride and/or silicon-carbon-oxynitride deposited from polysilazane can avoid the oxidation of the substrate during the application of the HTS layer, and thus enables homogeneous infrared properties of the back side.

In this manner, both the front side and the back side of the metal substrate can be prepared and protected in one step.

Figure 2:
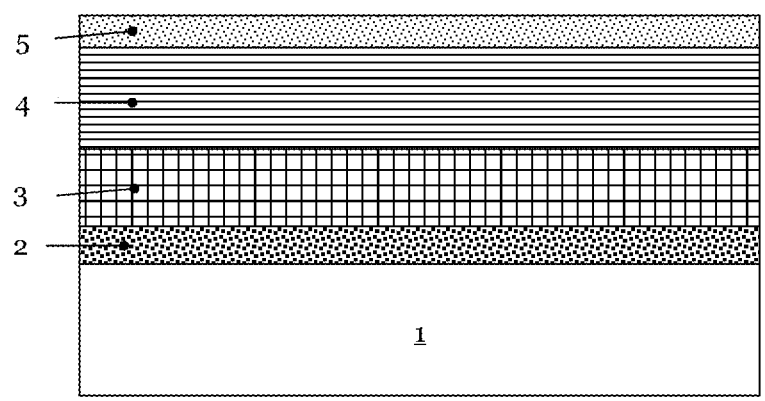
FIG. 2 shows a schematic cross section through a HTS tape which has smoothening layer manufactured with a method according to the invention (not drawn to scale)

FIG. 2 outlines a cross section of the principal setup of a HTS tape manufactured according to the described exemplary method. Since the substrate thickness is much larger compared to the layer thicknesses, the thicknesses of the individual layers are not drawn to scale. The amorphous or polycrystalline silicon oxynitride layer or silicon-carbon-oxynitride layer 2 which is generated from the polysilazane layer is located on the surface of the substrate 1. One or several buffer layers 3 generated by the well-known ISD or IBAD processes provide a bi-axial orientation for the subsequent HTS layer 4 at their surfaces. The HTS layer also grows bi-axially textured, and thus has a high current density>1 $MA/cm^2$. A metallic contact layer 5 having a low contact resistance≤1 $\mu\Omega \cdot cm^2$ to the superconductor is arranged on the surface of the superconducting functional layer 4. The contact layer acts for injecting the electrical current into the superconductor. The metallic contact layer 5 preferably comprises silver or a silver alloy. However, it is also possible to use other metals or metal alloys.

Figure 3:
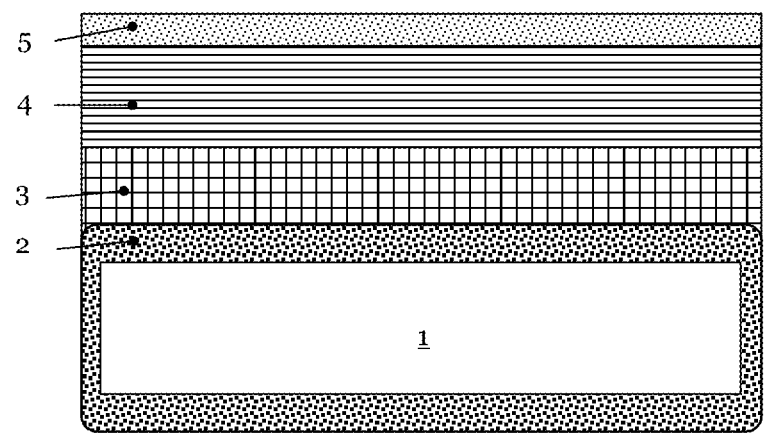
FIG. 3 represents a schematic cross section through a HTS tape which has a substrate including a smoothening layer manufactured with a method according to the invention (not drawn to scale)

FIG. 3 shows an analogues outline of the cross section of the HTS tape whose smoothening layer 2 which completely extends around the band substrate or metal substrate 1 is manufactured from polysilazane. For better clearness, the proportions are also not drawn to scale in this figure. The metal substrate 1 is encapsulated by the amorphous or polycrystalline silicon oxynitride layer or silicon-carbon-oxynitride layer. In particular, the back side of the substrate is thus protected from strong oxidation. One or several buffer layers 3 generated by the well-known ISD or IBAD processes provide a bi-axial orientation for the subsequent HTS layer 4 at their surface. HTS layer 4 also grows with a bi-axial texture, and thus has a high current density>1 $MA/cm^2$. A metallic contact layer 5—preferably made of silver—which has a low contact resistance≤1 $\mu\Omega \cdot cm^2$ to the HTS layer 4 is located on the surface of the superconducting functional layer 4 for current injection.

Figure 4:
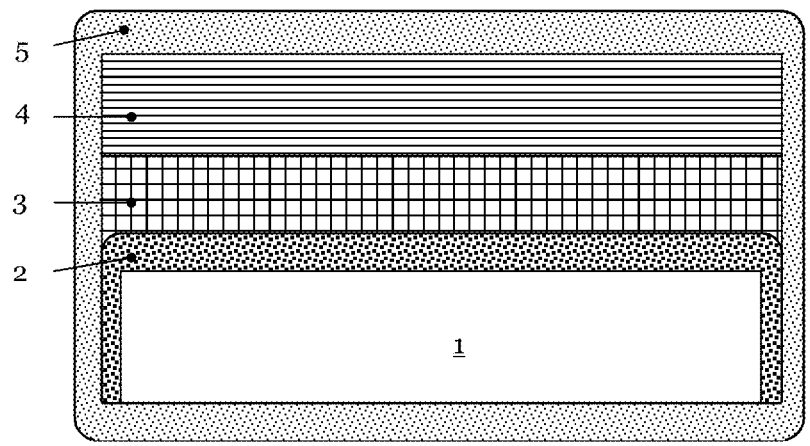
FIG. 4 represents a schematic cross section of the HTS tape of FIG. 3, wherein the smoothening layer on the back side has been re-moved prior to applying the metallization and an all-around metallization has been applied on the HTS tape.

Prior to the deposition of the metal layer 5, the protecting ceramic layer 2 can selectively be removed from the back side of the substrate. By an all-round coating with a contact metal 5 the HTS layer 4 can also be connected with the substrate 1 in an electrically conductive manner. FIG. 4 presents this variant with a revolving metallization. The metal layer 5, preferably of silver or a silver alloy, has direct electrical contact to the substrate 1 and to the HTS layer 4. It is also possible to apply different metals and/or metal alloys on the HTS layer and on the back side of the substrate.

Example 1

A Hastelloy® C276 metal substrate is drawn out from a 20 weight-% PHPS solution in dibutyl ether with a velocity of 30 cm/min and is subsequently brought in an oven under the atmosphere surrounding and is heated up to 700° C., wherein the oven has a heating increase of 5 K/min. The metal substrate is kept at this temperature for one hour, and is then cooled down to room temperature with the same cooling decrease. The resulting layer thickness is approximately 800 nm. On this layer a 3 µm thick bi-axially textured MgO layer is arranged by means of the ISD process by means of an electron beam evaporation using a tilting angle of 35° to the substrate normal. An MgO cover layer having a thickness of 300 nm is deposited on this layer also by an electron induced evaporation at 800° C. The orientation of the layer within the substrate plane is smaller (better) than 10° measured at the half width of the (200) X-ray reflex by rotating the substrate around the normal direction. A $DyBa2Cu3O6$ layer with a thickness of 1 µm is deposited by an electron induced evaporation on this MgO buffer layer. Then a silver layer having a thickness of 200 nm is vapor deposited. The tape manufactured in this way is loaded with oxygen in an oven under a pure oxygen atmosphere by cooling down with a rate of 50 K/min from 600° C. to room temperature and thereafter has a current density>1 $MA/cm^2$ and a contact resistance between HTS layer and the silver layer of less than 1 $\mu\Omega \cdot cm^2$.

Example 2

The manufacturing procedure follows the first example. A PHPS layer having a thickness of 500 nm is generated by pulling out the metal substrate with 50 cm/min from a solution comprising 10 weight-% PHPS which is solved in dibutyl ether. However, the temperature treatment of the PHPS layer occurs when passing through a zone oven in a surrounding atmosphere. Instead of a uniform slow heating ramp the applied PHPS solution is dried with a slow heating rate of 5 K/min up to 120° C. and is then treated up 700° C. by a rapid heating with an increase of 100 K/min, and is then cooled down again with the same rate.

Example 3

The manufacturing procedure occurs according to example 2. Prior to coating with silver the back side of the substrate is thermo mechanically freed from the ceramized PHPS layer and the metal substrate is laid open. The silver coating occurs by continuously rotating the substrate all around, prior to loading with oxygen as discussed in the previous example.

Example 4

Even for electro polished surfaces the deposition of a polysilazane smoothening layer leads to an improvement of the surface properties. This is represented in the AFM images (atomic force microscope) of FIGS. 5 and 6. Hastelloy® C276 comprises a low alloy portion of Wolfram (W) which is only slowly attacked by electro polishing and which can lead to separations preferably along grain boundaries. This is clearly visible in FIG. 5 which shows such particles with a height of approximately 30 nm (vertical scale). The particle density is in the order of magnitude of $2 \cdot 10^{11}$ cm$^{-2}$ and can severely influence the layer grows of the orientation layer and the HTS layer. The stripes in FIG. 5 as well as in the subsequent FIG. 6 are artifacts in the printing of the AFM images.

Figure 5:
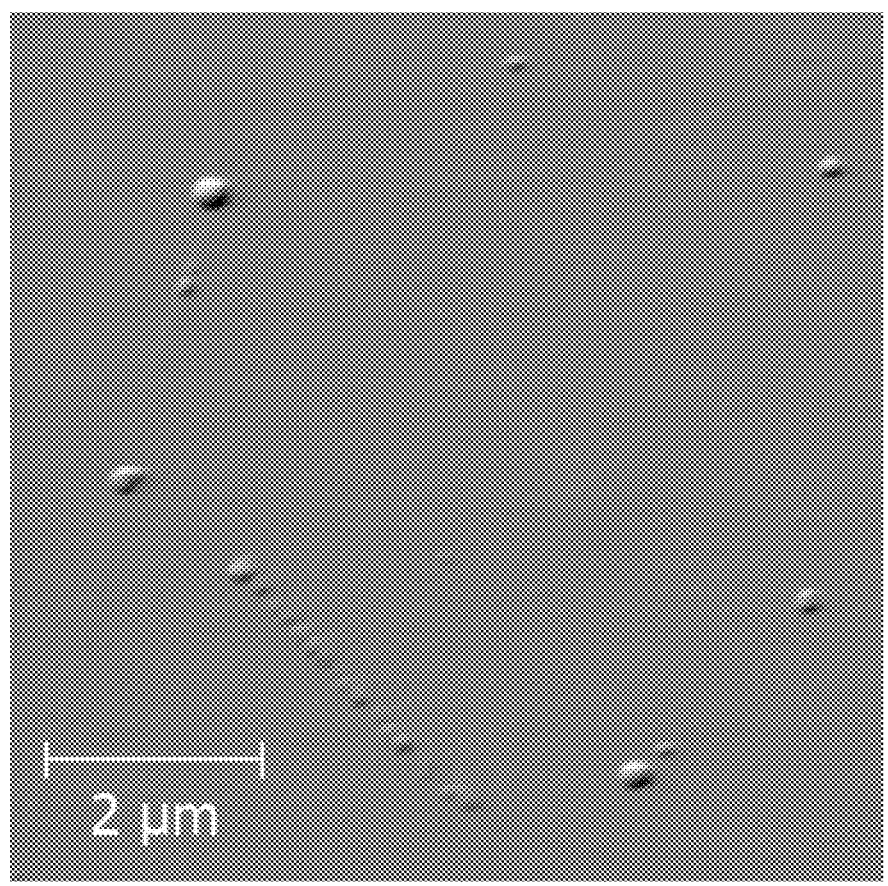
FIG. 5 displays an atomic force microscope (AFM) image of an electro polished Hastelloy C276 surface, wherein the vertical scale (black-white) comprises 30 nm.
Figure 6:
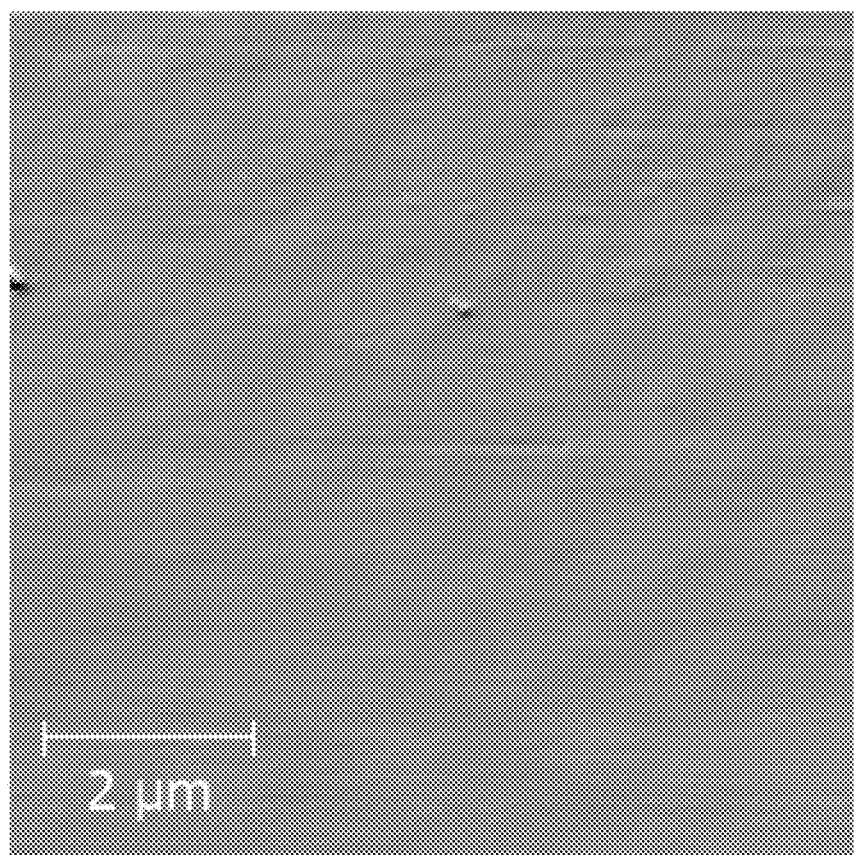
FIG. 6 shows an AFM image of the electro polished Hastelloy C276 surface of FIG. 5 after coating its surface with a smoothening layer having a thickness of 500 nm which comprises perhydropolysilazane (PHPS).

FIG. 6 shows the surface of FIG. 5 after the surface is coated and ceramized with a PHPS layer according to example 1. The thickness of the ceramic layer is approximately 500 nm and the ceramic layer completely embeds the available particles so that no larger particles are virtually visible on the surface in the range of an area of 64 μm$^2$. By applying a polysilazane containing a liquid on a band substrate and a subsequent ceramization, the density of disturbing particles can thus be reduced by more than a factor of 10 below an area density of $2 \cdot 10^{10}$ cm$^2$ in the example represented in FIG. 6.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A method for applying a smoothening layer on a band substrate for a subsequent manufacturing of a high temperature superconductor tape, the method comprising the steps:
    a. applying a liquid containing polysilazane on at least one side of the band substrate; and
    b. heating the liquid containing polysilazane to a temperature≥450° C. for depositing a layer on the band substrate comprising silicon oxynitride ($SiN_xO_y$, wherein 0≤x<0.6 and 1.0<y≤2.0) and/or silicon-carbon-oxynitride ($SiC_xN_yO_z$, 2·y<x≤1.0, 0<y<0.2 and 1.0<z≤2.0).

2. The method according to claim 1, wherein the deposited layer has a surface roughness of <10 nm.

3. The method according to claim 1, wherein the deposited layer has a thickness of 0.01 μm-10.0 μm.

4. The method according to claim 1, wherein the composition of the deposited layer changes with the depths of the layer.

5. The method according to claim 1, wherein the band substrate comprises a metal stripe which has a surface roughness of >20 nm.

6. The method according to claim 1, wherein step b. is performed at a surrounding atmosphere.

7. The method according to claim 1, wherein step b. is performed in a pure oxygen atmosphere, or in a shielding gas atmosphere.

8. The method according to claim 1, wherein steps a. and b. are successively executed several times.

9. The method according to claim 1, further comprising the step: adjusting the thickness of the deposited layer by selecting a viscosity of a polysilazane solution and/or by selecting a concentration of the polysilazane solution.

10. The method according to claim 1, wherein the deposited layer has an adhesive strength>10 N·mm$^{-2}$ on the substrate.

11. The method according to claim 1, wherein the polysilazane comprises perhydropolysilanze, PHPS, and the liquid comprises a solution of PHPS in dibutyl ether.

12. The method according to claim 11, wherein the PHPS solution comprises 10 weight-% to 20 weight-% PHPS.

13. The method according to claim 11, wherein the temperatures for heating the polysilazane solution is in the range of 600° C.-700° C., and/or wherein a temperature increase occurs with 5° C./min, and/or a maximum temperature is maintained for ≤60 minutes, and/or a temperature drop occurs with 5° C./min.

14. The method according to claim 11, wherein a mean nitrogen content of the deposited layer containing silicon oxinitride is less than 30 atom-%, preferred less than 25 atom-%, and is most preferred in the range of 15 atom-%-20 atom-%.

15. The method according to claim 11, wherein the oxygen portion of the deposited layer containing silicon oxynitride decreases from the surface in the depth, and the silicon portion and the nitrogen portion increase.

16. The method according to claim 1, wherein the polysilazane comprises polycarbosilazane (PCS), and the liquid comprises a solution of PCS in toluol and/or in ether.

17. The method according to claim 16, wherein the PCS solution comprises 10 weight-%-20 weight-% PCS, and/or wherein the deposited layer comprises silicon-carbon-oxynitride.

18. The method according to claim 1, wherein step a. comprises applying the liquid containing polysilazane on a front side and a back side, and the method comprises the further steps:
    c. depositing at least one high temperature superconductor layer on the front side of the band substrate;
    d. removing the layer containing silicon oxynitride and/or silicon-carbon-oxynitride from the back side of the band substrate; and
    e. applying a metal and/or a metal alloy at least on the back side of the band substrate.

19. The method according to claim 18, wherein step e. comprises: applying the metal and/or the metal alloy on the high temperature superconductor layer and on the back side of the band substrate.

20. The method according to claim 18, wherein the metal comprises silver.

21. A backside contact layer for a high temperature superconductor tape manufactured according to claim 18.

22. A band substrate for the manufacture of a high temperature superconductor tape manufactured according to the method of claim 1.

23. A method for manufacturing a high temperature superconductor tape, the method comprises the following step:
    depositing at least one high temperature superconductor layer on a tape substrate manufactured according to claim 1.

24. A high temperature superconductor tape comprising:
    a. a band substrate;
    b. at least one smoothening layer manufactured on the band substrate according to claim 1; and
    c. at least one high temperature superconductor layer.

* * * * *